United States Patent [19]
James et al.

[11] Patent Number: 5,322,817
[45] Date of Patent: Jun. 21, 1994

[54] IN SITU GROWTH OF TL-CONTAINING OXIDE SUPERCONDUCTING FILMS

[75] Inventors: Timothy W. James, Goleta; Boo J. L. Nilsson, Santa Barbara, both of Calif.

[73] Assignee: Superconductor Technologies, Inc., Santa Barbara, Calif.

[21] Appl. No.: 809,045

[22] Filed: Dec. 16, 1991

Related U.S. Application Data

[63] Continuation of Ser. No. 598,134, Oct. 16, 1990, abandoned.

[51] Int. Cl.$^5$ .......................... B05D 3/06; B05D 5/12
[52] U.S. Cl. .................................... 505/474; 505/732; 505/730; 427/62; 427/596; 427/314; 427/126.3; 427/595
[58] Field of Search .................... 505/1, 732, 783, 730; 427/62, 63, 126.3, 53.1, 42, 314, 596, 595

[56] References Cited

U.S. PATENT DOCUMENTS

| | | | |
|---|---|---|---|
| 4,878,989 | 11/1989 | Purdes | 156/613 |
| 4,950,642 | 8/1990 | Okamoto et al. | 505/1 |

FOREIGN PATENT DOCUMENTS

WO89/08605 9/1989 PCT Int'l Appl.

OTHER PUBLICATIONS

Eckstein et al, "Automatically Layers Heteroepitaxial . . . " Appl. Phys. Ltrs. 57 (9), 27 Aug. 1990, pp. 1049-1051.

Eckstein et al, "Growth of Untwinned Bi2Sr2Ca2-Cu3Ox Thin . . . " Appl. Phys. Ltrs. 57 (10), 3 Sep. 1990, pp. 931-933.

Koren et al, "Role of Atomic Oxygen in the Low-Temperature Growth of YBa$_2$Cu$_3$O$_{7-8}$ Thin Films by Laser Ablation Deposition", Appl. Phys. Lett. 54(19) May 1989, pp. 1920-1922.

Nakayama et al, "In Situ Growth of Bi-Si-Ca-Cu-O Thin Films by Molecular Beam Epitaxy Technique with Pure Ozone" Jpn. J. Appl. Phys. vol. 28(7) July 1989 L1217-1219.

Liou et al, "Pulsed laser evaporation of Tl-Ba-Ca-Cu-O Films", Proc. of the Conference on the Sci. and Technology of Thin Film Superconductors, (Colorado Springs, Colo.) Nov. 1988 pp. 35-43.

Nabatame et al, "Properties of Tl$_2$Ba$_2$Ca$_2$Cu$_3$Ox Thin films with a critical temperature of 122K prepared by Excimer laser Ablation," Jpn. J. Appl. Phys. 29(10) Oct. 1990 L813-5.

Hong et al, "Superconductivity Tl-Ba-Ca-Cu-O films by sputtering", Appl. Phys. lett. 53(21) Nov. 1988 pp. 2102-2104.

Ginley et al, "Sequential electron beam evaporated films of Tl$_2$CaBa$_2$Cu$_2$Oy with zero resistance at 97K", Appl. Phys. lett. 5-3(5) Aug. 1988 pp. 406-408

Kwo et al, "In Situ epitaxial growth of Y$_1$Ba$_2$Cu$_3$O$_{7-x}$ films by molecular beam epitaxy with an activated oxygen source", Appl. Phys. let. 53(26) Dec. 1988 pp. 2683-85.

Hase et al, "Partial oxygen pressure effects on the morphology of Y-Ba-Cu-O thin films in laser deposition process", J. Appl. Phys. 68(1) Jul. 1990 pp. 374-376.

Witanachchi et al, "Deposition of superconducting Y-Ba-Cu-O films at 400°C. without post-annealing", Appl. Phys. lett. 53(3) Jul. 1988 pp. 235-236.

Berkley et al, "In Situ formation of superconducting YBa$_2$Cu$_3$O$_{7-x}$ thin films using pure ozone vapor oxidation", Appl. Phys. lett. 53(20) Nov. 1988, pp. 1973-1975.

*Primary Examiner*—Roy King
*Attorney, Agent, or Firm*—Lyon & Lyon

[57] ABSTRACT

In situ vapor phase growth of thallium containing superconductors is achieved by controlling thallium volatility. Thallium volatility is controlled by providing active oxygen at the surface of the growing material and by avoiding collisions of energetic species with the growing material. In the preferred embodiment, a thallium containing superconductor is grown by laser ablation of a target, and by provision of oxygen during growth. More specifically, a source of thallium, calcium, barium, copper and oxygen is created by laser ablation of a thallium rich target, generating an ablation plume that is directed onto a heated substrate through the oxygen, with the plume passing through oxygen having a pressure from $10^{-2}$ to ten torr. Epitaxial superconducting thin films of thallium, calcium, barium, copper and oxygen have been grown by this technique. Various superconducting phases may be engineered through use of this method.

9 Claims, 1 Drawing Sheet

IN SITU GROWTH OF TL-CONTAINING OXIDE SUPERCONDUCTING FILMS

This is a continuation of co-pending application Ser. No. 07/598,134, filed on Oct. 16, 1990, now abandoned.

DESCRIPTION

1. Field of the Invention

This invention relates to methods for in situ growth of superconducting films which include materials having relatively high vapor pressures. Specifically, the invention relates to in situ growth of superconducting films containing thallium.

2. Background of the Invention

The phenomenon of superconductivity was first observed by Kamerlingh Onnes in 1911. Superconductivity refers to that state of metals and alloys in which electrical resistivity is zero when the specimen is cooled to a sufficiently low temperature. The temperature at which a specimen undergoes the phase transition from a state of normal electrical resistivity to a superconducting state is known as the critical temperature $T_c$. Until recently, the critical temperature in known superconducting materials was relatively low, requiring expensive cooling apparatus, including the use of liquid helium.

Starting in early 1986, with the announcement of a superconducting material having a critical temperature of 30° K., materials having successively higher transition temperatures have been announced. Currently, superconducting materials exist which have critical temperatures well in excess of the boiling point of liquid nitrogen, a relatively inexpensive and simple to use coolant.

Initially, compounds which exhibited relatively high temperature superconductivity were based on the combination of alkaline earth metals and rare earth metals such as barium and yttrium in conjunction with copper, typically referred to as YBCO compounds. After the YBCO compounds, compounds containing bismuth were discovered. Starting in early 1988, thallium based superconductors have been prepared, generally where the compositions have various stoichiometries of thallium, calcium, barium, copper and oxygen. To date, the highest transition temperatures for superconductors have been observed thallium containing compounds. Six different superconducting phases have been identified. See, e.g., S. S. P. Parkin, Y. Y. Lee, A. I. Nazzal, R. Savoy, T. C. Huang, G. Gorman, and Beyers, Phys. Rev. B. 38, 6531 (1988).

The transition temperatures range from 90° K. for $TlCaBa_2Cu_2O_x$ (the "1122 phase") to 123° K. for $Tl_2Ca_2Ba_2Cu_3O_x$ (the "2223 phase"). Additionally, a number of different thallium based compounds have been identified, some of which include lead. All of these compounds will be collectively referred to as thallium containing compounds.

It is generally accepted that the best quality high temperature superconductor films are epitaxial films grown on single crystal substrates, and that the preferred method for crystal growth is by vapor phase deposition techniques. In situ growth, that is, direct growth of the crystal on the substrate from the vapor phase, has been achieved for certain types of superconducting compounds. For example, superconducting films of yttrium, barium, copper and oxygen (YBCO) have been grown in situ using vapor deposition techniques. Significantly, the YBCO compound contains species with virtually no volatility over the range of deposition temperatures of interest. Consequently, the substrate temperature may be raised to a temperature sufficient to promote adequate atomic mobility which in turn permits high quality crystal growth. YBCO films have been grown in situ by using laser ablation techniques, that is, by use of a pulsed laser to ablate a composite target, and using molecular beam epitaxy (MBE) techniques.

Attempts to grow thallium based superconducting films have not been successful. A major obstacle to in situ growth of thallium containing films has been the volatility of the thallium. Conflicting processing requirements are presented in processing thallium. On the one hand, in order to obtain in situ growth of a crystal, the substrate must be heated to a temperature high enough to allow sufficient surface mobility of the arriving atoms. On the other hand, the thallium volatility increases with temperature, which limits the maximum temperature at which deposition can occur. As understood by the prior art, these temperature ranges do not overlap. Specifically, it is generally believed that the minimum temperature for adequate atomic mobility for successful phase formation is in excess of approximately 500° C., whereas the maximum temperature for incorporation of thallium is 400° C. Accordingly, viewed from the standpoint of the prior art, the conflicting process requirements seemingly preclude in situ growth for superconductors containing high vapor phase materials such as thallium. Indeed, one worker has publicly stated his disbelief that thallium containing compounds can be grown in situ because of the volatility problem. W. Y. Lee, Electronic Materials Conference, Santa Barbara, Calif, Jun. 27-29, 1990.

Previously, the most satisfactory method for growth of thallium containing superconducting films has consisted of a multi-step process of amorphous deposition of the mixed oxide precursors followed by a post-deposition annealing step. Various methods and apparatus which have proved successful for growing thallium containing films have been disclosed in the following applications assigned to the assignee of this application, and are incorporated herein by reference; Olson et al., Superconducting Thin Layer Composition and Methods, Ser. No. 07/238,919, filed Aug. 31, 1988; Olson et al.. Liquid Phase Thallium Processing and Superconducting Products, Ser. No. 7/308,149, filed Feb. 8, 1989; and Eddy et al., Controlled Thallous Oxide Evaporation For Thallium Superconductor Films and Reactor Design, Ser. No. 07/516,078, filed Apr. 27, 1990. More particularly, the metal oxide precursors comprising thallium, calcium, barium, copper and oxygen are amorphously deposited on a substrate, for example, by a laser ablation technique, and are subject to post deposition annealing. Various techniques are described therein to overcome the problem of thallium volatility.

The desirability of growing thallium based films from the vapor phase is clear. Given the relatively high transition temperature of thallium based compounds, coupled with the possibility of single crystal epitaxial growth by in situ deposition, high quality films would result. However, attempts to grow thallium based superconducting films in situ have been tried without success, and workers in the field have expressed disbelief that thallium containing films can be successfully grown.

SUMMARY OF THE INVENTION

Superconducting phases of thallium containing thin films are grown by controlling thallium volatility, principally through the provision of active (elemental) oxygen at the surface of the film during film growth. The method comprises the following steps. First, the substrate is heated to a temperature sufficient to permit adequate surface mobility to result in growth of the desired crystal phase. Second, a vapor phase of the desired materials including thallium is generated. Third, an intermediate active oxygen region is created adjacent to the growing film.

In the preferred embodiment, the vapor phase is created by laser ablation of a thallium rich target. Active oxygen is created by collision of the energetic species in the vapor with oxygen in the chamber. The 1122 phase has been successfully grown at a temperature of 575° C. utilizing laser ablation of a thallium rich target with an oxygen pressure of 4 torr.

Three key variables for controlling the film growth have been identified. These factors are: suppression of thallium volatility, that is, maintaining phase stability in the film, providing sufficient active oxygen for incorporation of the arriving cation species in the vapor arriving at the substrate, and reduction in bombardment of the growing film by energetic species, which causes resputtering and damage of the film which leads to thallium volatilization.

Any source of vapor generation and oxygen formation consistent with these variables may be utilized. For example, the vapor phase may be created using conventional molecular beam epitaxy apparatus. The active oxygen may be created through microwave dissociation of oxygen, or by providing ozone which is thermally dissociated.

Accordingly, it is a principal object of this invention to provide a method for growing in situ superconducting films which include a high vapor pressure component.

It is a further object of this invention to provide a technique for generation of higher quality thallium based superconducting thin films than possible with current methods.

It is yet a further object of this invention to provide a technique for growth of epitaxial films of thallium based superconductors.

DETAILED DESCRIPTION OF THE INVENTION

In one embodiment of this invention, laser ablation is used to create a vapor for deposition, and active oxygen is created by collisions of the energetic species in the vapor with oxygen. The oxygen pressure in the chamber is increased to provide formation of adequate active oxygen. This embodiment is described in detail with respect to FIG. 1.

Figure 1:
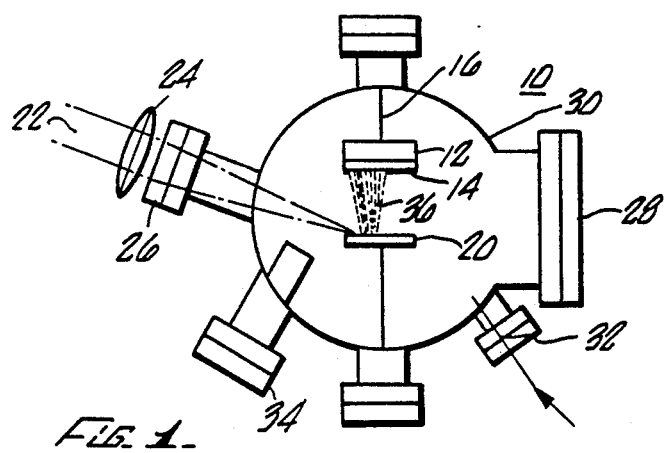
FIG. 1 shows a cross-sectional view of the laser ablation vacuum system.

FIG. 1 shows a cross-sectional view of the laser ablation vacuum system 10. The substrate 12 and growing film 14 are thermally coupled to a non-rotating heated substrate holder 16. The heater comprises an inconel block that is heated with a quartz halogen lamp. The substrate 12 is thermally bonded to the block 16 by indium solder. The temperature is measured by a thermocouple buried in the block 16 directly beneath the substrate 12. A single hot pressed $Tl_8Ca_2Ba_2O_x$ (Tl 53% atomic) composition target 20 is positioned opposite the substrate 12. Preferably, the target contains excess thallium, as it has been found to increase thallium incorporation in films deposited at elevated temperatures. The target 20 is preferably made to rotate.

A laser having the desired energy is focused on the target 20 for purposes of ablation. A Siemens XeCl/308 nm excimer laser (model XP2020) was used to produce pulses with a beam uniformity of $+-5\%$ and a pulse to pulse instability of less than 1%. The use of a laser which produces a laser beam 22 having uniform beam intensity and pulse to pulse stability is desirable, in part to ensure that ablation, as opposed to evaporation, occurs at the target 20. The laser beam 22 is focused through lens 24 and enters the vacuum chamber 30 via laser window 26. An optional view port 28 may be provided for viewing into the vacuum chamber 30.

Oxygen gas ($O_2$) is provided to the chamber 30 via the gas inlet 32. The vacuum chamber 30 is associated with a vacuum system (not shown) capable of generating vacuum pressures at least as low as 1 torr. In overview, the method for growth of thallium containing superconductor phases on a substrate 12 are as follows. The substrate 12 is prepared in accordance with known techniques, including cleaning and polishing of the substrate 12. In the preferred embodiment, a substrate of lanthanum aluminate $LaAlO_3$ may be used as the substrate 12. The target 20 is prepared, as described above, preferably being rich in thallium. Next, the vacuum chamber 30 is evacuated and the desired oxygen pressure is provided via inlet port 32. The substrate 12 is heated to the desired temperature by irradiating the inconel block 16 with a quartz halogen lamp (not shown). For deposition, the laser light 22 is focused on the target 20 via the lens 24. A laser energy density range of 2 to 8 J per $cm^2$ provides sufficient energy to ablate the target 20. It has been discovered that the thallium content ablated from the target 20 decreases rapidly when the laser energy density drops below the ablation threshold, approximately 1.5 J per $cm^2$. A pulsed laser beam 22 is preferably used, having a repetition rate between 0.1 Hz and 100 Hz. As the target 20 is ablated by the laser beam 22, a plume 36 is directed to the substrate 12.

A number of variables have been identified which relate to the effective formation of desired superconducting phases. First, the thallium volatility must be suppressed during the time between the laser pulses, that is, phase stability must be promoted. Second, there must be sufficient atomic oxygen at the surface of the film 14 during the arrival of the plume 36 at the substrate. Third, bombardment of the growing film 14 by energetic species in the plume 36 must be reduced, in order to reduce resputtering from the film 14 and damage which increases thallium loss from the film 14. All of these factors must be controlled in engineering various superconducting phases and crystal quality.

In the particular case of the growth of 1122 phase on a $LaAlO_3$ substrate 12, a substrate temperature of 575°

C. and an oxygen pressure of 4 torr resulted in epitaxial growth of a 1122 phase film 14. Other phases may be engineered by varying parameters consistent with these objectives. Generally, growth of films at higher temperatures permits formation of high quality films of the desired phase.

In the preferred embodiment, active oxygen is provided adjacent the film surface 14 by providing diatomic oxygen $O_2$ within the vacuum chamber 30. Collisions between the $O_2$ and energetic species in the vapor ablation plume 36 create active oxygen O, and some ozone $O_3$. Thermal dissociation of the ozone on the heated substrate 12 also results in active oxygen formation. In the case of 1122 phase growth, the $O_2$ pressure is on the order of the plume beam 36 equivalent pressure, which is roughly 1 torr. The maximum oxygen pressure usable is that at which the transport of material from the target 20 to the substrate 12 stops due to excess collisions when the mean free path is much less than the distance between the target 20 and substrate 12. For formation of the 1122 phase with a substrate temperature of 575° C., the approximate lower $O_2$ pressure limit is 1 torr under the conditions of a laser energy of approximately 4 J/cm$^2$. Oxygen pressures down to $10^{-2}$ torr may be used if the laser energy is correspondingly reduced.

By increasing the $O_2$ pressure, the film quality is improved for three principle reasons. First, by reducing the mean free path for the energetic species in the plume 36, the species are slowed, thereby reducing the potential for resputtering from the film 14 and causing damage of the growing film. Second, the additional $O_2$ pressure is needed to generate sufficient atomic oxygen for phase formation and phase stability in the film 14. Third, the higher $O_2$ pressure provides oxygen between the laser pulses 22 to stabilize thallium loss from the already formed crystal in film 14.

It has been discovered that the presence of active oxygen increases the temperature at which a thallium based superconductor retains phase stability. For example, when heated in a vacuum, thallium remained in a film to 400° C. but not 500° C. In contrast, when heated with a 5% mixture of ozone and oxygen, the thallium remained in the film to 600° C. Accordingly, the oxygen pressure must be determined in light of the dual functions of providing sufficient active oxygen for reaction with the growing film to promote phase stability, and to reduce the energy level of the energetic species in the plume 36.

Any source of vapor generation and oxygen formation may be utilized if they are consistent with the three variables of suppression of thallium volatility, providing sufficient active oxygen, and reduction in bombardment of the growing film by energetic species.

In another embodiment, the problems associated with the existence of the energetic species in the laser ablation plume 36, which are moderated by the relatively high oxygen pressure, are avoided by use of sources which inherently provide relatively low energy species. In this embodiment, provision of sufficient atomic oxygen at the surface of the film during arrival of the cations may be met by techniques other than use of high oxygen chamber pressure. These are described below.

For example, the vapor phase may be created using conventional molecular beam epitaxy apparatus similar to that used for semiconductor multilayer film growth. Specifically, Knudsen effusion cells, electron beam evaporation cells, or gas cracking cells provide the inherently low energy vapor species sources for the cations (such as thallium, calcium, barium, lead). The cation sources may be either the metals themselves or oxides of the metals. Typically, the chamber pressure during film growth would be in the $10^{-4}$ to $10^{-7}$ torr range. The cation sources would provide fluxes in the range of $10^{13}$ to $10^{18}$ atoms cm$^{-2}$sec$^{-1}$ at the growing surface, with the preferred range being $10^{14}$ to $10^{16}$ atoms cm$^{-2}$sec$^{-1}$. Substrate temperatures between 400° and 1000° C. are effective depending on the desired phase.

The active oxygen may be provided by any technique which provides sufficient active oxygen at the growing film. In addition to generation of active oxygen by collision of energetic species with oxygen, the active oxygen may be created through microwave dissociation of oxygen, or by providing ozone which is thermally dissociated.

EXPERIMENTAL RESULTS

Table 1 summarizes 17 deposition experiments which were conducted to determine the effects of deposition conditions on film chemistry and properties. Experiments nos. 4-12 were run at ambient temperatures to study the ablation and transport processes, and experiments nos. 13-20 were made at elevated temperatures to determine the conditions necessary for phase formation.

TABLE 1

| 1 | PRESSURE (torr.) | TEMP. (°C.) | ENERGY (J/cm2) | COMMENTS | Tl at % | Ca at % | Ba at % | Cu at % | XRD |
|---|---|---|---|---|---|---|---|---|---|
| 4 | 0.2 | 25 | 2.4 | | | | | | amphorous |
| 5 | 0.2 | 25 | 7 | | 50.2 | 13.8 | 14.4 | 23.1 | amphorous |
| 6 | 0.2 | 25 | 4.1 | | 51.5 | 13.7 | 15.1 | 20.8 | amphorous |
| 7 | 0.2 | 25 | 1.9 | | 50.6 | 13.8 | 14.2 | 22.8 | amphorous |
| 8 | 0.2 | 25 | 4.1 | | 51.8 | 14.0 | 12.2 | 23.3 | amphorous |
| 9 | 0.005 | 25 | 4.4 | smooth | 51.3 | 13.0 | 15.3 | 21.5 | amphorous |
| 10 | 0.2 | 25 | 4.4 | | 51.0 | 14.7 | 15.2 | 20.3 | amphorous |
| 11 | 0.1 | 25 | 4.4 | | 57.4 | 10.4 | 12.9 | 19.3 | amphorous |
| 12 | 0.02 | 25 | 4.4 | smooth | | | | | amphorous |
| 13 | 0.21 | 460 | 4.4 | cauliflower | 52.1 | 13.3 | 13.6 | 22.1 | |
| 14 | 0.2 | 500 | 4.4 | some surface mobility | 56.4 | 9.9 | 12.2 | 21.7 | unknown phases |
| 15 | 0.2 | 550 | 4 | surface mobility | 2.3 | 31.7 | 29.5 | 46.9 | unknown phases |
| 16 | 1 | 550 | 4.7 | micro polycrystalline | 20.4 | 24.6 | 24.8 | 37.1 | 1122 |
| 17 | 4 | 550 | 7.8 | | 34.4 | 12.7 | 17.6 | 39.2 | no 1122 |
| 18 | 4 | 575 | 9.4 | "EPI" | 14.6 | 18.0 | 25.8 | 49.0 | 1122 |
| 19 | 12 | 585 | 7.7 | no transport | | | | | |

TABLE 1-continued

| | PRESSURE (torr.) | TEMP. (°C.) | ENERGY (J/cm2) | COMMENTS | Tl at % | Ca at % | Ba at % | Cu at % | XRD |
|---|---|---|---|---|---|---|---|---|---|
| 20 | 1 | 575 | 7.4 | microwave O | 3.5 | 29.7 | 23.8 | 53.3 | |

A silicon (100) substrate was used for the ambient temperature runs to aid in analysis of the deposited material. The higher temperature runs were deposited on LaAlO3 to permit manufacture of superconducting films. The target to substrate distance was 5 cm., except on run 8 where it was 7 cm. The laser pulse rate was 10 Hz. All of the runs were conducted on a system as described above with respect to FIG. 1.

Analysis of the ambient temperature experiments demonstrated that chemical composition of the films deposited at ambient temperature were not affected significantly by the distance between the substrate 12 and the target 20. The thallium content in the deposited film was clearly reduced for depositions at 5 mtorr relative to deposition at 200 mtorr. It is believed that the reduced thallium content is due to preferential resputtering by energetic species at low chamber pressures. Above 200 mtorr, the plume species lose most of their kinetic energy by collisions with the chamber gases and do not have sufficient energy to resputter the depositing film 14 to a significant degree.

The surface morphology of the deposited films varied with chamber pressure, but not over the laser energy range investigated. Films deposited at low pressure were smooth with the exception of micron sized round particles, typically of laser ablation produced deposits. Films deposited at 200 mtorr have rough surfaces typical of ambient temperature deposits made by evaporation. The film surface gradually got rougher between 5 mtorr and 200 mtorr. It is believed that the smooth surfaces are the results of both bombardment and resputtering of the deposit by energetic species. Bombardment provides some surface mobility to the arriving species and assistance in planarizing the surface. However, it is believed that resputtering is the dominant effect for these films. The lower thallium content in the low pressure deposits indicates resputtering is occurring. Resputtering occurs preferentially under these conditions, due in part to the large range in atomic mass for the various species.

It had previously been discovered in connection with in situ YBCO deposition that the film growth rate per laser pulse increases with chamber pressure in the range of 0.1 to 1 torr. In the absence of energetic species, increases in chamber pressure would be expected to decrease the net transport from target 20 to substrate 12. The increase in transport at higher chamber pressures indicates that the chamber gas is slowing energetic species in the plume 36, thereby reducing resputtering of the deposit faster than decreasing the transport efficiency. The net result is an increase in net deposition with increasing pressure. The limit for this effect is around 10 torr.

The results at the elevated temperature show that thallium incorporation in the deposited film 14 decreases dramatically above 550° C., and that this decrease can be offset by increasing the chamber pressure. The 1122 phase was formed at both 550° C. and 575° C., although the crystalline quality was much improved at the higher temperature. These films exhibited some epitaxy and showed a mixture of metallic and semiconducting R(T) behavior. Other phases, such as 2122 and 2223, may be engineered by varying the substrate temperature, modifying the target composition and providing efficient sources of activated oxygen.

Figure 2:
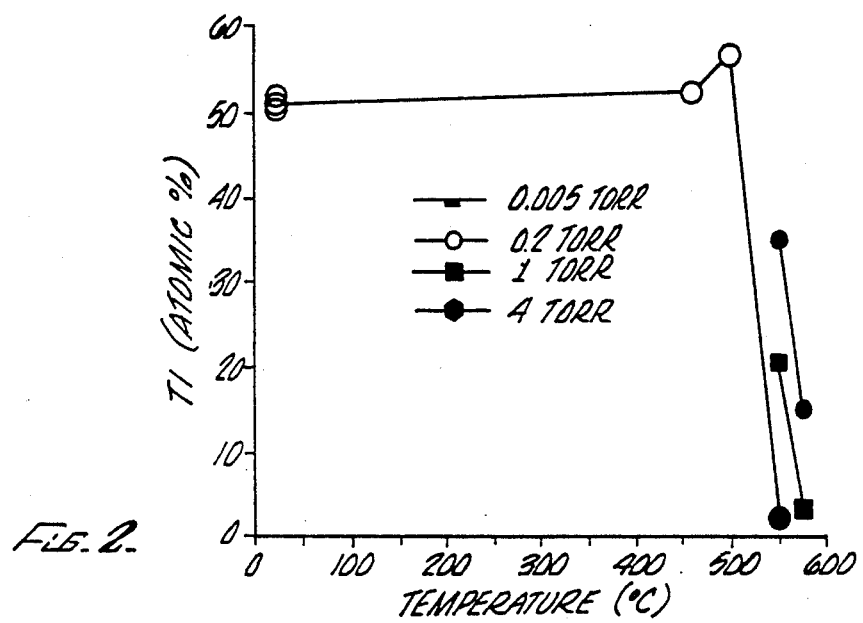
FIG. 2 shows a graph of the percentage incorporation of thallium versus chamber pressure of oxygen for various substrate temperatures.
Figure 3:
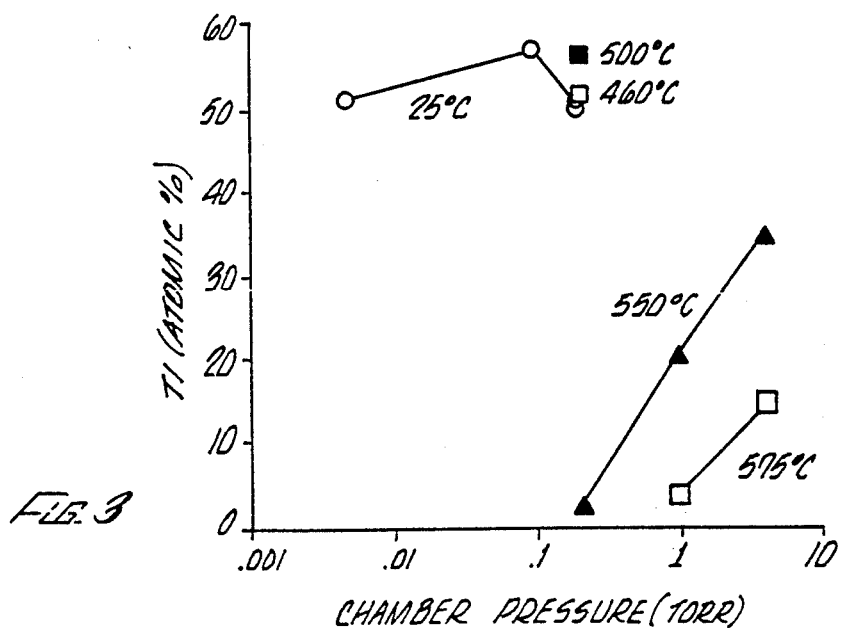
FIG. 3 shows the thallium incorporation percentage as a function of temperature for various oxygen pressures.

FIG. 2 shows the dramatic decline in the net thallium incorporation at temperatures above 550° C. We believe this drop is produced by a combination of effects, including resputtering of thallium from the deposit by energetic species in the ablation plume 36, and instability of thallium at the film surface (loss of thallium as Tl2O) between laser pulses. As shown, the thallium incorporation can be increased significantly by increasing chamber oxygen pressure. The data are replotted in FIG. 3 to show this effect more directly.

The surface morphology of films grown at elevated temperatures indicates a significant surface mobility at temperatures above 500° C. Significant surface mobility is required for formation of a crystalline, single phase, epitaxial film, requiring temperatures well above 500° C. for formation of additional phases with the desired crystalline quality.

Though the invention has been described with respect to a specific preferred embodiment, many variations and modifications will become apparent to those skilled in the art. It is therefore the intention that the appended claims be interpreted as broadly as possible in view of the prior art to include as such variations and modifications.

What is claimed is:

1. A method for depositing a thallium based copper oxide superconducting film on a crystalline substrate, comprising the steps of:
    heating the substrate to a temperature which permits adequate surface mobility for crystal formation,
    providing oxygen between the substrate and a thallium containing target in a pressure between $10^{-2}$ and 10 torr,
    creating a source of thallium by laser ablating the target, and
    depositing said thallium-based copper oxide superconducting film on said substrate.

2. The method of claim 1 wherein the film contains thallium, calcium, barium, copper and oxygen.

3. The method of claim 1 wherein the target to be laser ablated includes at least thallium, calcium, barium and copper.

4. The method of claim 2 wherein the target to be laser ablated contains excess thallium in comparison with the stoichiometry of the superconducting film.

5. The method of claim 1 wherein the pressure is between 1 and 10 torr.

6. The method of claim 1 wherein the substrate is heated to a temperature greater than 500° C.

7. The method of claim 1 wherein the oxygen includes active oxygen.

8. The method of claim 7 wherein the active oxygen is provided by disassociation of ozone.

9. The method of claim 7 wherein the active oxygen is provided by microwave disassociation of diatomic oxygen.

* * * * *